(12) United States Patent
Zhu et al.

(10) Patent No.: US 8,188,796 B2
(45) Date of Patent: May 29, 2012

(54) DIGITAL PHASE-LOCKED LOOP CLOCK SYSTEM

(75) Inventors: Dan Zhu, High Point, NC (US); Reuben Pascal Nelson, Colfax, NC (US); Timir Raithatha, Greensboro, NC (US); Wyn Palmer, Greensboro, NC (US); John Cavey, Oak Ridge, NC (US); Ziwei Zheng, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 51 days.

(21) Appl. No.: 12/838,719

(22) Filed: Jul. 19, 2010

(65) Prior Publication Data

US 2012/0013406 A1   Jan. 19, 2012

(51) Int. Cl.
*H03L 7/099* (2006.01)
*H03L 7/18* (2006.01)

(52) U.S. Cl. ............... 331/34; 331/14; 331/1 A; 327/159

(58) Field of Classification Search ............... 331/14, 331/18, 25, 34, 1 A; 327/113, 114, 115, 327/117, 147, 156, 159
See application file for complete search history.

(56) References Cited

U.S. PATENT DOCUMENTS

| | | | |
|---|---|---|---|
| 7,046,098 B2 | 5/2006 | Staszewski | |
| 7,295,077 B2 | 11/2007 | Thomsen et al. | |
| 7,385,539 B2 | 6/2008 | Vanselow et al. | |
| 7,436,227 B2 | 10/2008 | Thomsen et al. | |
| 7,692,499 B2 * | 4/2010 | Liu et al. | 331/17 |
| 2007/0152757 A1 * | 7/2007 | Sridharan | 331/1 A |
| 2008/0191762 A1 * | 8/2008 | Seethamraju et al. | 327/158 |
| 2008/0284531 A1 * | 11/2008 | Hornbuckle | 331/1 A |
| 2008/0315960 A1 | 12/2008 | Waheed et al. | |
| 2009/0121792 A1 | 5/2009 | Travis | |
| 2009/0256601 A1 | 10/2009 | Zhang et al. | |

OTHER PUBLICATIONS

Any-Rate Precision Clocks Family Reference Manual, Silicon Labs, 2008.
PCT International Search Report and Written Opinion for PCT/US11/40450 mailed on Oct. 4, 2011.
Quad/Octal Input Network Clock Generator/Synchronizer, AD9548, Analog Devices, 2009.
Dual Input Network Clock Generator/Synchronizer, AD9549, Analog Devices, 2007.

* cited by examiner

*Primary Examiner* — Ryan Johnson
(74) *Attorney, Agent, or Firm* — Kenyon & Kenyon LLP

(57) ABSTRACT

A clock system includes a digital phase/frequency detector (DPFD), a buffer, a digitally-controlled oscillator (DCO) including a sigma-delta modulator (SDM), an adder, a first frequency divider. The DPFD may have a first input for a reference input clock, a second input for a feedback signal, the DPFD generating an output representing a difference between the reference input clock and the feedback signal. The buffer may be coupled to the DPFD for storing the difference signal over time. The SDM may have a control input coupled to the buffer. The adder may have inputs coupled to the SDM and a source of an integer control word. The first frequency divider may have an input for receiving an external clock signal and a control input coupled to the adder, the DCO generating an output clock signal having an average frequency representing a frequency of the external clock signal divided by (N+F/M).

25 Claims, 4 Drawing Sheets

DIGITAL PHASE-LOCKED LOOP CLOCK SYSTEM

FIELD OF THE INVENTION

The present invention is generally directed to a digital clock system that may be used to generate a clock for a circuit system. In particular, the present invention is directed to a clock system that may generate a highly stable and high performing clock using a digital phase-locked loop (DPLL) circuit and a fractional divider based digitally-controlled oscillator (DCO).

BACKGROUND INFORMATION

Digital Phase Locked Loop (DPLL) circuits may be used to generate system clocks. The DPLL may generate a system clock based on a reference input clock. When the DPLL loses the reference input clock during operation, the DPLL operates in a holdover event. Certain systems may require their system clock to perform accurately even in the holdover events. The holdover frequency accuracy may be defined in terms of a maximum fractional frequency offset and drift over a period of time.

Analog Devices Inc., the assignee of the present invention, manufactures integrated circuits that include a direct digital synthesizer (DDS) and a digital-to-analog converter (DAC) to implement a digitally-controlled oscillator within a DPLL. A digital control word may tune the DDS to generate a digital clock which is converted into an analog sine wave by the DAC. However, the DDS+DAC implementation requires a filter for removing harmonics at the DAC output. The filter cannot easily be fabricated within the integrated circuit in which the DPLL is fabricated, and therefore, it is provided as an external component, which increases cost and complexity of the clock system. Additionally, the DDS+DAC design requires a comparator for converting the sine waves to square waves so that the square waves can be used as a system clock. These extra components occupy additional space and increase cost.

Therefore, there is a need for a highly stable and high performance clock system that is persistent and accurate during holdover events, but consumes less power and costs less.

DETAILED DESCRIPTION OF EXAMPLE EMBODIMENTS

Embodiments of the present invention may provide a digitally-controlled oscillator (DCO) that may include a sigma-delta modulator (SDM) with a modulus (M), an adder, and a multi-modulus divider (MMD). The SDM may, responsive to a control signal for generating a pattern of integer values that, averaged over a period of time, have a fractional value (F/M) as determined by the digital control signal (F). The adder may have a first input coupled to the SDM and a second input for receiving an integer value (N). The MMD may have a control input coupled to an output of the adder and a clock input coupled to a stable source clock, the MMD performing integer frequency division of a clock signal presented at the input terminal based on values present at the control input, in which the division takes the form $1/(N+F/M)$ averaged over the period of time.

Embodiments of the present invention may provide clock system that may include a digital phase/frequency detector (DPFD), a buffer, a digitally-controlled oscillator (DCO) including a sigma-delta modulator (SDM), an adder, a first frequency divider. The DPFD may have a first input for a reference input clock, a second input for a feedback signal, the DPFD generating an output representing a difference between the reference input clock and the feedback signal. The buffer may be coupled to the DPFD for storing the difference signal over time. The sigma-delta modulator (SDM) may have a control input coupled to the buffer. The adder may have inputs coupled to the (SDM) and a source of an integer control word. The first frequency divider may have an input for a clock signal and a control input coupled to the adder, the DCO generating an output clock signal having an average frequency representing a frequency of the input clock signal divided by $(N+F/M)$, in which N is determined by the integer control word and F/M is determined by an output of the SDM. The system clock also may include a second frequency divider coupled to the DCO output clock signal outputting the feedback signal to the DPFD.

Figure 1:
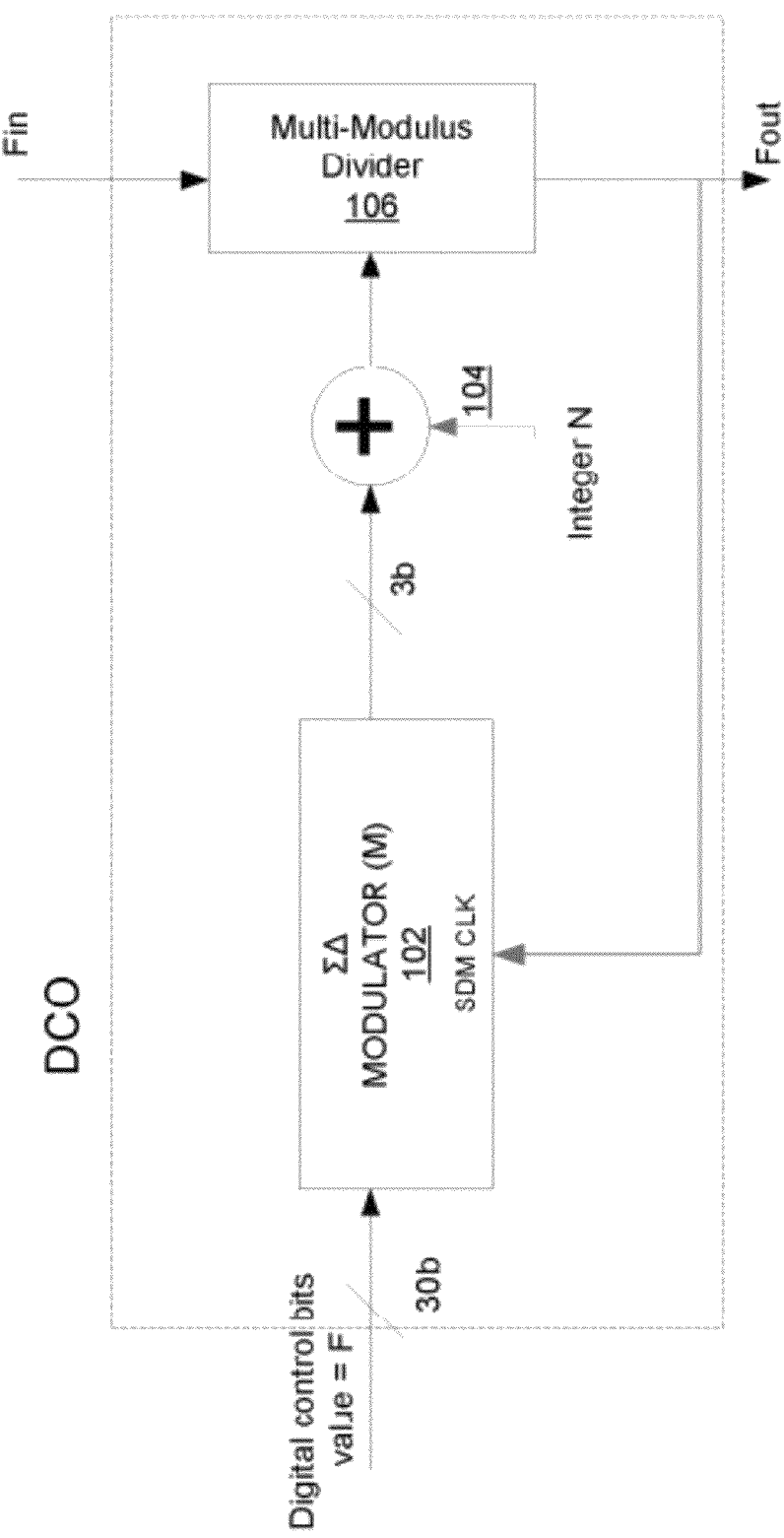
FIG. 1 illustrates a digitally-controlled oscillator (DCO) according to an exemplary embodiment of the present invention.

FIG. 1 illustrates a digitally-controlled oscillator 100 (DCO) according to an exemplary embodiment of the present invention. The DCO 100 may include a sigma delta modulator (SDM) 102, an adder 104, and a multi-modulus divider (MMD) 106. The SDM 102 may generate a digital control output to the adder 104. The adder 104 may add an externally supplied integer value N to the control output from the SDM 102 to generate an integer control word to the MMD 106. The control word may vary among a variety of integer values as determined by the SDM output but, over a predetermined period of time, the control word may have an average value of $N+F/M$, where N is the externally-supplied integer and F/M is the average value of the SDM output. The MMD 106 may receive an input clock signal $F_{in}$ and generate a frequency-divided output clock signal $F_{OUT}$ according to the values output from the adder 104. Although the instantaneous operation of the MMD is that of an integer divider, over time, the frequency of the output clock take the form $F_{out}=F_{in}/(N+F/M)$.

In the exemplary embodiment illustrated in FIG. 1, the SDM 102 may receive a 30 bit control word F that governs its operation. The SDM is shown as outputting a 3 bit integer value to the adder, which may take values of −1, 0, 1 and 2, for example. However, the SDM 102 is not limited to the particular 30 to 3 bit conversion. As illustrated, the $F_{OUT}$ clock generated by the DCO 100 may be input to the SDM 102 as a driving clock to a system circuit.

Figure 2:
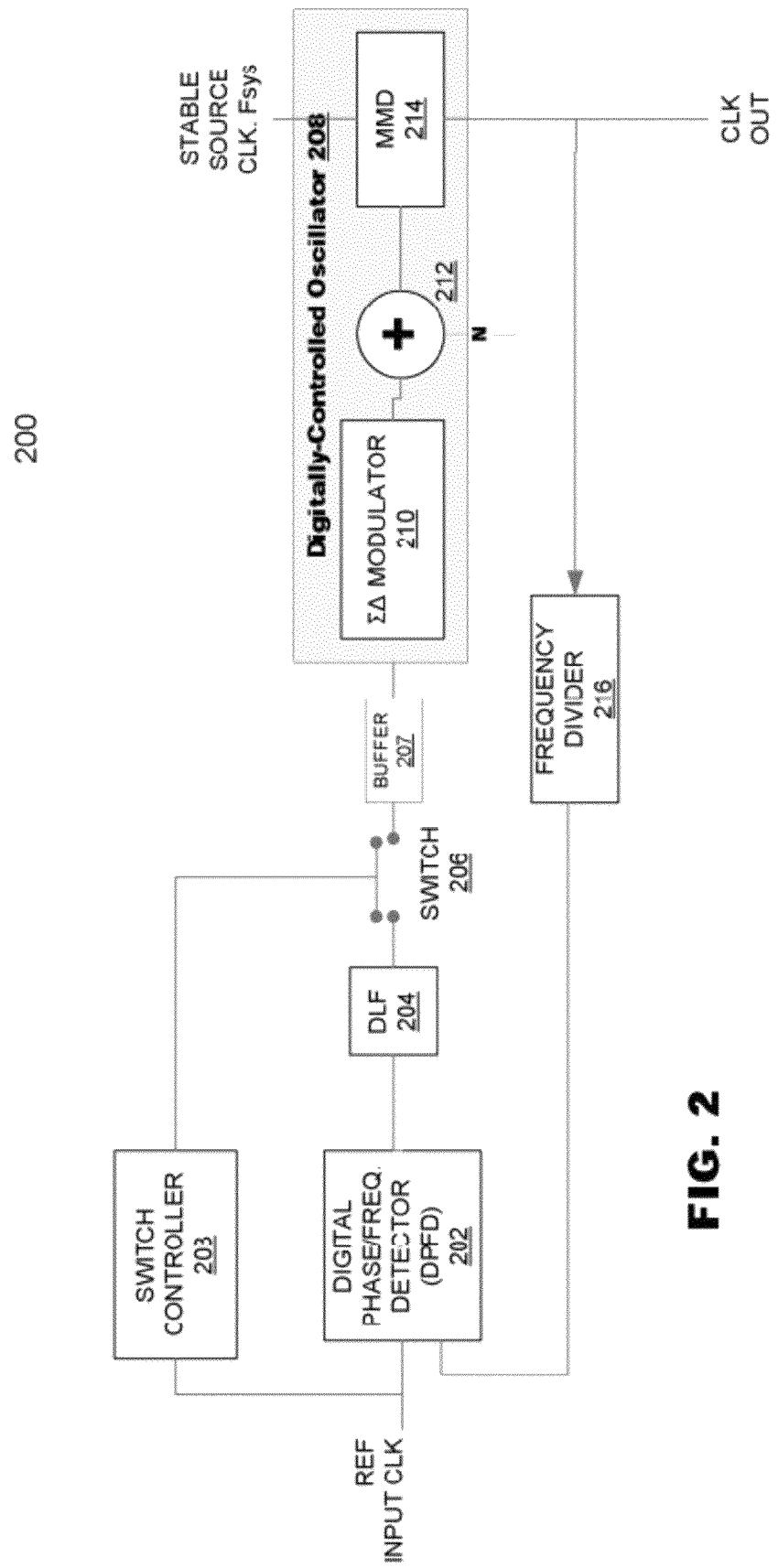
FIG. 2 illustrates a clock system according to an exemplary embodiment of the present invention.

FIG. 2 illustrates a clock generator 200 according to an embodiment of the present invention. The clock generator 200 may include a forward signal path and a feedback signal path to form a signal loop. Along the forward signal path, the clock generator may include a digital phase/frequency detector (DPFD) 202, a digital loop filter (DLF) 204, a buffer 207, and a digitally-controlled oscillator (DCO) 208. Along the feedback signal path, the clock system may include a frequency divider 216. The DCO may include a sigma delta modulator (SDM) 210, an adder 212, and a multi-modulus divider (MMD) 214. The clock generator 200 may also include a switch 206 and a switch controller 203.

The DPFD 202 may include two input terminals with a first input terminal receiving a reference input clock and a second input terminal receiving a feedback signal from the feedback signal path. The DPFD 202 may compare the reference input clock with the feedback signal to calculate a difference signal representing the phase and/or frequency differences between the two input signals of DPFD 202. The DLF 204 coupled to an output terminal of DPFD 202 may normally receive and perform low-pass filtering of the difference signal to generate control bits. The DLF 204 may be coupled to a buffer 207 via a switch 206. The buffer 207 may be a data storage device that is capable of persistently holding the control bits even at times when the forward signal path is cut off. The buffer 207 may store variations of the output from DLF 204. For example, the buffer 207 may store the current one of the control bits or an average of control bits over a predetermined time period.

The DCO 208 may have a control input terminal coupled to the buffer 207 for receiving the control bits stored in the buffer and a clock input terminal coupled to a stable source clock $F_{sys}$. Within the DCO 208, the SDM 210 may be coupled to the control input terminal for receiving the control bits and generate a digital word pattern based on the supplied control bits where the digital word pattern may have a target average value of F/M. The adder 212 may be coupled to the SDM 210 for receiving the time-averaged control bits and add a constant to the time-averaged control bits. The MMD 214 may have a clock input coupled to the stable source clock $F_{sys}$ and have a control input coupled to the adder 212 for receiving a control word. The MMD 214 may produce a clock output that divides $F_{sys}$ by the number represented by the control word.

The $F_{sys}$ may be a stable source clock in the sense that, during a holdover event when the reference input clock becomes invalid—i.e., when it is lost or out of a specified valid frequency range, $F_{sys}$ still may supply a sustained clock $F_{sys}$ to the DCO 208. The $F_{sys}$ may be supplied from a highly-stable source clock such as a crystal oscillator (XO), temperature-compensated XO (TCXO), or an oven-controlled XO (OCXO). Under certain circumstances, the $F_{sys}$ may be synthesized from a highly-stable source clock using an internal frequency multiplier to achieve a high frequency stable source clock. As such, the control bits from the buffer of the DLF 204 may tune the DCO 208 (or provide frequency adjustments) for generating an output clock for the clock system.

The feedback signal path may include a frequency divider 216 provided between the output clock and the second input terminal of the DPFD 202. In one example embodiment of the present invention, the frequency divider 216 may be an integer frequency divider (N1) that divides the frequency of the output clock by an integer N1. Alternatively, the frequency divider 216 may be a fractional frequency divider that may divide the frequency of the output clock by a fractional number. The output clock may be supplied through the feedback signal path to the DPFD 202 for a comparison with the reference input clock so that the difference between the reference input clock and the output clock may be used to control the DCO 208 during normal operation.

The switch 206 may be provided along the forward signal path in a place before the buffer and be controlled by a switch controller 203 based on the state of the reference input clock. In a preferred embodiment, the switch 206 may be coupled between the DLF 204 and the buffer 207. However, the switch 206 is not limited to this particular location, and it may be placed in other parts of the circuit for the same results. For example, in one embodiment, the switch 206 may be placed between the DPFD 202 and the DLF 204.

Thus, the switch controller 203 may cause the switch 206 be engaged during normal operation when the reference input clock to the first input terminal of the DPFD 202 is active. However, if a holdover event arises when the reference input clock becomes invalid, the absence of the reference input clock may cause the switch controller to disengage the switch 206 and thus cut off the forward signal path. However, the control bits stored in the buffer still may maintain their values and supply control bits to the DCO 208. Since the control bits held in the buffer may sustain a supply of stable control bits to the DCO 208, a persistent output clock may be maintained even during a holdover event.

Figure 3:
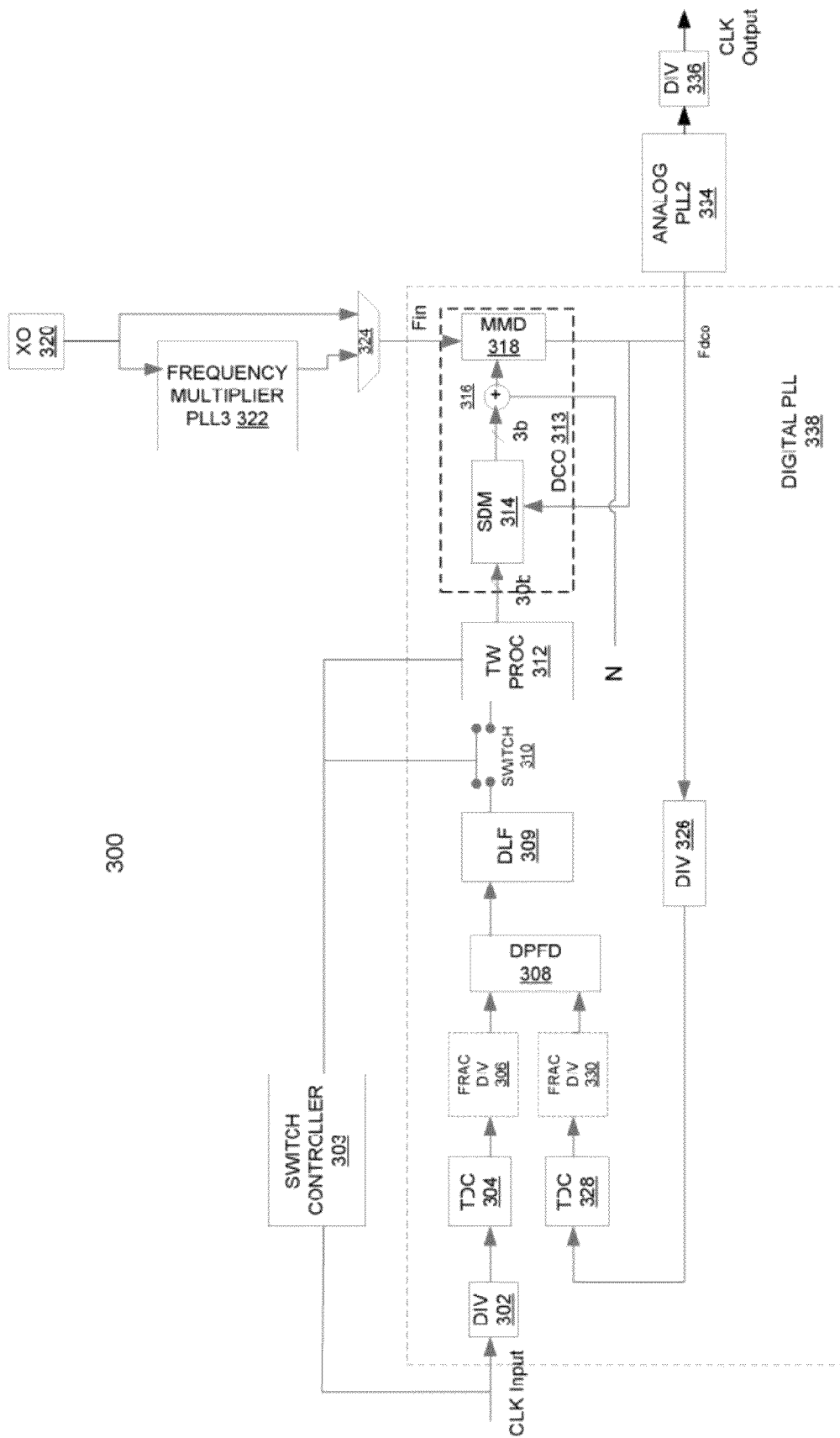
FIG. 3 illustrates another clock system according to an exemplary embodiment of the present invention.

FIG. 3 illustrates another clock system according to an embodiment of the present invention. The clock system 300 may include a forward signal path and a feedback signal path to form a loop. The output of the loop formed by the forward and feedback signal paths may be a persistent digital clock signal ($F_{dco}$). Additionally, the clock system 300 may include an analog PLL (analog PLL2) to filter the $F_{dco}$ to remove jitter contained in the $F_{dco}$.

The forward signal path of the clock system may include a first integer frequency divider 302, a time-to-digital converter (TDC) 304, and a digital phase and frequency detector (DPFD) 308. The forward signal path further may include a digital loop filter (DLF) 309, a switch 310, a tuning word processor 312, and a DCO 313 as described in FIG. 1 (with different labels) which may include a sigma delta modulator (SDM) 314, an adder 316, and multi-modulus divider (MMD) 318. The switch 310 may be controlled by a switch controller 303 based on whether the reference input clock is available or not. The switch controller 303 also may supply a control signal to the tuning word processor 312 to control its operation. The feedback signal path may include a second integer frequency divider 326 and a second time-to-digital converter (TDC) 328. The clock system 300 also may include a crystal oscillator (XO) 320, an alternative frequency multiplier (PLL3) 322, and a multiplexer 324 together to provide a stable source clock. The clock system also may include an analog PLL (PLL2) 334 and a frequency multiplier 336 for filtering and frequency multiplication of the final output clock.

Along the forward signal path from upstream to downstream, the first integer frequency divider 302 may be coupled to a reference input clock for dividing the frequency of the reference input clock by a predetermined integer value. The first TDC 304 coupled to the first integer frequency divider 302 may convert the reference input clock to a digital reference input clock. The DPFD 308 may have two input terminals for receiving two digital signals to be compared at the DPFD 308. The first input terminal of the DPFD 308 may be coupled to the first TDC 304, and the second input terminal of the DPFD 308 may be coupled to the feedback signal path to receive a feedback signal. The DPFD 308 may output at an output terminal a difference signal that represents the phase/frequency difference between the digital reference input clock and the feedback signal. The output of DPFD 308 may be coupled to the DLF 309 that may perform low-pass filtering of the difference signal to generate tuning words as control bits to the DCO 313.

Figure 4:
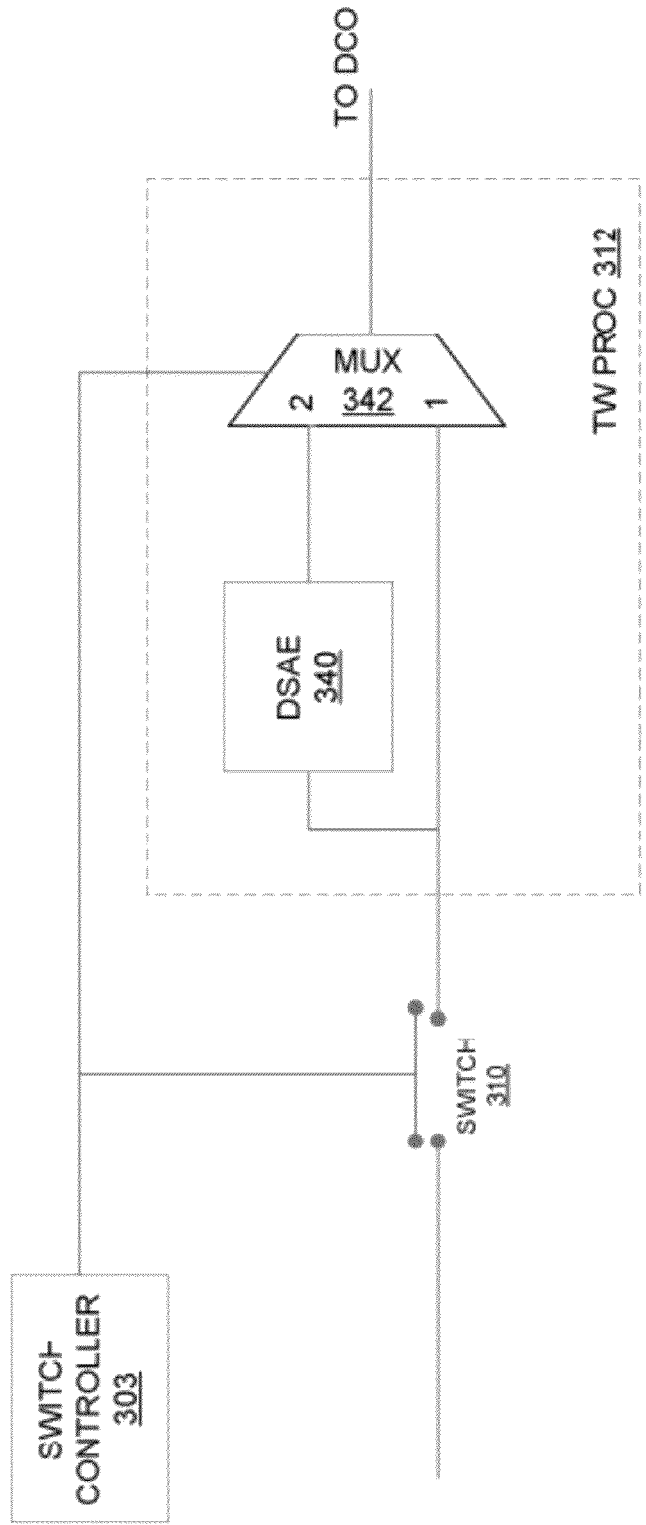
FIG. 4 illustrates a tuning word processor according to an exemplary embodiment of the present invention.

The forward signal path further may include a switch 310 coupled to the output terminal of the DLF 309. The switch 310 may be controlled by the switch controller 303 based on the state of the reference input clock. The switch controller 303 may cause the switch 310 to be engaged during normal operation when the reference input clock is available to the clock system 300. However, if a holdover event arises when the reference input clock becomes invalid, the switch controller 303 may cause the switch 310 to disengage the DLF 309 from the tuning word processor 312. The tuning word processor 312 may be coupled to the switch 310 opposite to the output of the DLF 309. The tuning word processor 312 may be a controller device that may be configured with functionalities. FIG. 4 illustrates an example tuning word processor according to an exemplary embodiment of the present invention. Referring to FIG. 4, the tuning word processor 312 may include a data storage and average element (DSAE) 340 and a multiplexer 342. In one embodiment, the DSAE 340 may be a memory that stores output from DLF 309 and/or computes the average of the DLF output over a time period. A data input of the tuning word processor may be externally coupled to the switch 310 and internally to an input of the DSAE 340 and a first input of the multiplexer 342. The output of the DSAE 340 may be coupled to a second input of the multiplexer 342. The tuning word processor 312 also may have a control input that may externally coupled to the switch controller 303 for receiving the control signal and internally to the control pin of the multiplexer 342. Thus, during normal operation, the switch controller 303 may cause the switch 310 engaged and the output of the multiplexer 342 connected to its first input. In this way, the output of DLF may be directly fed to the DCO, and at the same, stored and/or averaged at the DSAE 340. However, if a holdover event arises, the switch controller 303 may cause the switch 310 disengaged and at about the same time, the output of the multiplexer 342 connected to its second input. In this way, the forward signal path is cut off by the disengaged switch 310. However, the DCO may still receive the stored or average control bits stored in the DSAE 340 through the second input of the multiplexer 342.

The tuning word processor 312 also may be provided to tailor response of the DCO 313 based on the filtered error. For example, a variety of non-linear response curves may be loaded into the DSAE 340 of the tuning word processor 312 to effect a desired response. In this regard, the DSAE 340 may store one or more conversion tables, which may be indexed by the filtered error signal from the DLF 309. Also, the tuning word processor 312 may include a processor (not shown) configured with an algorithm to directly compute the response from the filtered errors from the DLF 309.

The DCO 313 as similarly described above in conjunction with FIG. 1 may be coupled to the tuning word processor 312. The SDM 314 of the DCO 313 may receive the control bits and modulate the control bits to produce a modulated control bits (F/M) which may be added by an integer N at the adder 316 to generate a control bit of (F/M+N) for the MMD 318. The MMD 318 of the DCO 313 also may receive a stable source clock that may not be interrupted during holdover events. The stable XO 320 may generate a clock signal which may be frequency multiplied by PLL3 322 or which alternatively may be fed directly to the multiplexer 324 through which the stable source clock $F_{in}$ may be supplied to the MMD 318. The output of the DCO 313 $F_{dco}$ (or the output of the forward-and-feedback loop) may be controlled by the control bits, or $F_{dco}=F_{in}/(F/M+N)$.

The feedback signal path may be coupled between the output terminal of the DCO 313 and the second input terminal of the DPFD 308. Along the feedback signal path, a second integer frequency divider 326 may be coupled to the output of the DCO 313 to divide the frequency of $F_{dco}$ by an integer. A second TDC 328 may be coupled to the second integer frequency divider for converting the clock $F_{dco}$ into a digital feedback clock signal.

In one example embodiment of the present invention, an optional first fractional frequency divider 306 may be provided between the first TDC 304 and the DPFD 308, and an optional second fractional frequency divider 330 may be provided between the second TDC 330 and the DPFD 308.

During normal operation, the reference input clock may be supplied to the forward signal path of the clock system. The DPFD 308 may compare the frequency and/or phase differences between the reference input clock and feedback signals to generate a digital difference signal which may be converted into a sequence of tuning words (TW1) by the DLF 309. The switch 310 may be engaged so that the output of DLF 309 may be directly supplied to the tuning word processor 312. The tuning word processor 312 may normalize TW1 to generate the control bits (TW2). The output buffer of the tuning word processor 312 may be updated periodically with new control bits (TW2) based on the difference signal. The control bits may determine the frequency ratio between $F_{dco}$ and $F_{in}$ according to $F_{dco}=F_{in}/(N+F/M)$ where F is the control bits TW2. $F_{dco}$ may at one hand provide the feedback signal via the second integer frequency divider 326, the second TDC 328, and optionally the second digital frequency fraction divider 330 to the DPFD 308 for comparing with the reference input clock. $F_{dco}$ also may, through an analog PLL2 and a frequency multiplier 334, provide a system clock to a circuit system (not shown). The analog PLL2 334 may include a high frequency voltage-controlled oscillator (VCO) to scale up the DCO output to a higher frequency. The analog PLL2 334 also may provide noise filtering to the DCO output.

If a holdover event arises, the reference input clock may be lost. The loss may cause the switch controller 303 to disengage the switch 310 to cut off the forward signal path. However, the DSAE 340 of the tuning word processor 312 may keep its current control bits (or an average of the stored control bits) and provide stable control bits to the DCO 313 so that the DCO output $F_{dco}$ still may be stable and accurate. Since the control bits are stored digitally, they are highly stable and less sensitive to temperature variations. In this way, the clock system 300 may provide a persistent and accurate $F_{dco}$ even during holdover events.

The foregoing embodiments provide a clock generation system that performs frequency conversion of a reference clock signal at a variety of non-integer conversion factors and is operable even during holdover events in which the reference clock temporarily becomes invalid. Moreover, the clock system can be fabricated on a common integrated circuit with a reduced amount of external components such as external filters. Thus, the clock system generates an accurate clock with low integration costs when the clock is integrated with other processing systems (not shown).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A clock system, comprising:
   a digital phase/frequency detector (DPFD) having a first input for a reference clock, a second input for a feedback clock, the DPFD generating an output representing a difference between the reference clock and the feedback clock;
   a buffer coupled to the DPFD for storing the difference signal over time and outputting a control word (F);
   a digitally-controlled oscillator (DCO) comprising:

a sigma-delta modulator (SDM) having a control input coupled to the buffer, an adder having inputs coupled to the SDM and a source of an integer control word (N), and a first frequency divider having (1) a clock input for receiving an external source clock signal and (2) a control input coupled to the adder, the DCO generating an output clock signal having an average frequency representing a frequency of the external source clock signal divided by (N+F/M), wherein M is a modulus of the SDM; and a second frequency divider coupled to the DCO output clock signal outputting the feedback clock to the DPFD.

2. The clock system of claim 1, further comprising a digital loop filter provided between the DPFD and the buffer for low-pass filtering the output from the DPFD.

3. The clock system of claim 1, wherein the second frequency divider is an integer frequency divider or a fractional frequency divider.

4. The clock system of claim 1, wherein the external source clock signal is an active input to the DCO even at times when the reference clock is invalid.

5. The clock system of claim 1, further comprising:

a signal detector to identify times when the reference clock is invalid, wherein the buffer is coupled to the DPFD via a switch that, under control of the signal detector, disengages the buffer from the DPFD when the reference clock is invalid.

6. The clock system of claim 5, wherein when the switch disengages the buffer from the DPFD, the buffer holds the then-current value stored in the buffer or the average of stored values over a period of time.

7. The clock system of claim 1, further comprising a phase-locked loop coupled to the output of the DCO for multiplying a frequency of the DCO output clock.

8. The clock system of claim 1, wherein the DCO includes a feed-forward signal path that includes the SDM, the adder, and the first frequency divider.

9. The clock system of claim 1, wherein the DCO includes a feed-forward signal path that includes the SDM, the adder, and the first frequency divider, and wherein the feed-forward path does not include signal feedback.

10. The clock system of claim 1, wherein the DCO includes a feed-forward only signal path that includes the SDM, the adder, and the first frequency divider.

11. A clock system, comprising:

a forward signal path including:

a digital phase/frequency detector (DPFD) having a first input coupled to a reference input clock, a second input for a feedback signal, the DPFD generating a difference signal representing a phase/frequency difference between first and second inputs;

a controller coupled to the DPFD for scaling the difference signal and storing the scaled difference signal as control bits in a data storage and average element (DSAE); and a digitally-controlled oscillator (DCO) comprising:

a sigma-delta modulator (SDM) having a control input (F) coupled to the buffer, an adder having inputs coupled to the SDM and a source of an integer control word, and a first frequency divider having a clock input for receiving an external clock signal and a control input coupled to the adder, the DCO generating an output clock signal having an average frequency representing a frequency of the external clock signal divided by (N+F/M), wherein N is determined by the integer control word and M is a modulus of the SDM; and a feedback signal path coupled to a DCO output comprising:

a second frequency divider for providing the feedback signal to the DPFD.

12. The clock system of claim 11, wherein:

the forward signal path further comprises a first time-to-digital converter (TDC) provided between the reference input clock and the first input terminal of the DPFD; and the feedback signal path further comprises a second TDC provided between the frequency divider and the second input terminal of the DPFD.

13. The clock system of claim 12, wherein:

the second frequency divider is an integer or fractional frequency divider, the forward signal path further comprises a fractional frequency divider provided between the reference input clock and the first input terminal of the DPFD, and the feedback signal path further comprises a fractional frequency divider provided between the second frequency divider and the second input terminal of the DPFD.

14. The clock system of claim 11, wherein the forward signal path further comprises a digital loop filter provided between the output terminal of the DPFD and the controller.

15. The clock system of claim 11, further comprising a phase-locked loop coupled to the output of the DCO for multiplying a frequency of the DCO output clock and for noise filtering.

16. The clock system of claim 11, wherein the clock input to the DCO supplies to the first frequency divider even at times when the reference input clock is lost.

17. The clock system of claim 11, wherein the clock input to the DCO is frequency-multiplied before supplied to the first frequency divider.

18. The clock system of claim 11, further comprising:

a signal detector to identify times when the reference input clock is invalid, wherein the controller is coupled to the DPFD via a switch that, under control of the signal detector, disengages the controller from the DPFD when the reference input clock is invalid.

19. The clock system of claim 18, wherein when the switch disengages the controller from the DPFD, the DSAE holds the then-current control bits stored in the DSAE or an average of values stored over a period of time.

20. A clock generation method, comprising:

frequency dividing an external clock signal in response to a time varying control signal to generate an output clock signal, the control signal taking integer value that, over time, average to a value represented by N+F/M, wherein N is an integer value and F/M is a fractional value, generating the time-varying control signal by:

comparing, over time, a representation of the output clock signal to a reference clock signal;

storing results of the comparisons over time, the stored results determining the value of F, and outputting the stored results to a sigma-delta modulator, the sigma-delta modulator generating integer outputs that, over time, average to the F/M fractional value.

21. The method of claim 20, further comprising, during a period where the reference clock signal is inactive, engaging a holdover mode in which:

the control signal is held at a then-current value or an average value of values stored over a period of time, and the frequency division is performed using the held control signal value.

22. The method of claim 21, further comprising, when the reference clock becomes active following inactivity, disengaging the holdover mode in which ordinary operation of the time-varying control signal is resumed.

23. A clock system, comprising:
a digital phase/frequency detector (DPFD) having a first input for a reference clock, a second input for a feedback clock, the DPFD generating an output representing a difference between the reference clock and the feedback clock;
a buffer coupled to the DPFD for storing the difference signal over time;
a switch that disengages the buffer from the DPFD when the reference clock is lost;
a digitally-controlled oscillator (DCO), having a first input coupled to the buffer and a second input coupled to a source clock, the DCO generating an output clock signal; and
a frequency divider coupled to the DCO output outputting the feedback clock to the DPFD,
wherein the DCO comprises:
a sigma-delta modulator (SDM), responsive to a stored value from the buffer for generating a pattern of integer values that, averaged over a period of time, have a fractional value (F/M) as determined by the stored value;
an adder having a first input coupled to the SDM and a second input for receiving an integer value (N); and
a multi-modulus divider (MMD) having a control input coupled to an output of the adder and a clock input terminal coupled to an external source clock, the MMD performing integer frequency division of the external source clock based on values present at the control input, wherein the division takes the form 1/(N+F/M) averaged over the period of time.

24. The clock system of claim 23, wherein the clock system is contained within a common integrated circuit.

25. The clock system of claim 23, further comprising a frequency multiplying PLL coupled to a clock output of the DCO for frequency multiplication and noise filtering.

* * * * *